(12) United States Patent
Magee et al.

(10) Patent No.: US 8,743,634 B2
(45) Date of Patent: Jun. 3, 2014

(54) GENERIC LOW POWER STROBE BASED SYSTEM AND METHOD FOR INTERFACING MEMORY CONTROLLER AND SOURCE SYNCHRONOUS MEMORY

(75) Inventors: Terence J. Magee, San Francisco, CA (US); Cheng-Gang Kong, Saratoga, CA (US)

(73) Assignee: LSI Corporation, San Jose, CA (US)

( * ) Notice: Subject to any disclaimer, the term of this patent is extended or adjusted under 35 U.S.C. 154(b) by 796 days.

(21) Appl. No.: 13/016,071

(22) Filed: Jan. 28, 2011

(65) Prior Publication Data
US 2012/0195141 A1 Aug. 2, 2012

(51) Int. Cl.
*G11C 7/10* (2006.01)
(52) U.S. Cl.
USPC ................... 365/193; 365/233.1; 365/233.12
(58) Field of Classification Search
CPC ........ G11C 7/10; G11C 7/1072; G11C 7/222; G11C 11/4076; G11C 11/4093; G06F 1/10; G06F 1/12; G06F 1/08
USPC ................... 365/193, 233.1, 233.11, 233.13, 365/233.12; 713/503
See application file for complete search history.

(56) References Cited

U.S. PATENT DOCUMENTS

| | | | | |
|---|---|---|---|---|
| 6,151,271 | A * | 11/2000 | Lee | 365/230.03 |
| 6,507,888 | B2 | 1/2003 | Wu et al. | |
| 7,017,070 | B1 * | 3/2006 | Ho et al. | 713/503 |
| 7,243,254 | B1 | 7/2007 | Kuroodi et al. | |
| 7,460,431 | B1 | 12/2008 | Pan et al. | |
| 2002/0174311 | A1 * | 11/2002 | Ware et al. | 711/167 |
| 2010/0244913 | A1 | 9/2010 | Golding | |

* cited by examiner

*Primary Examiner* — Douglas King
(74) *Attorney, Agent, or Firm* — Kermit D. Lopez; Luis M. Ortiz; Ortiz & Lopez, PLLC (57) ABSTRACT

A system and method for interfacing a memory controller and a source synchronous memory utilizing a generic low power strobe. A set of double rate (2x) strobes can be generated by gating a continuous double rate clock in order to enable the set of double rate strobes only for duration of a data transfer from controller to the memory. The data and control from a SDR continuous single rate (1x) clock domain with respect to the memory controller can be moved to a set of double rate clock domain by sampling with the set of double rate strobes. The phase of the set of double rate strobes can be shifted in relation to the continuous single rate clock and a phase relationship of the generated synchronous signals to the memory can be dynamically switched by changing the phase of the set of double rate strobes. The set of double rate clock domain enables each bit-slice to be independently programmed to generate an output to the memory at each phase relative to the controller single rate clock.

11 Claims, 12 Drawing Sheets

GENERIC LOW POWER STROBE BASED SYSTEM AND METHOD FOR INTERFACING MEMORY CONTROLLER AND SOURCE SYNCHRONOUS MEMORY

TECHNICAL FIELD

Embodiments are generally related to electronic data storage systems and methods. Embodiments are additionally related to source synchronous interfaces. Embodiments are further related to a system and method for interfacing a memory controller and a source synchronous memory utilizing a generic low power strobe.

BACKGROUND OF THE INVENTION

The increase in computing speeds of modern computing systems has created a demand for developing high speed memory devices. A high-speed synchronous system generally requires a tightly controlled dock timing allowance for a high performance operation. With source-synchronous interfaces such as, for example, a double data rate synchronous dynamic random access memory (DDR SDRAM) and a single data rate (SDR) SDRAM interfaces, data and dock transport from a transmitter to a receiver and a receiver interface employs the dock to latch an accompanying data. The device that transmits data also generates a data strobe signal that travels toward the receiving device along with the data signals. A source-synchronous SDR interface outputs data from the transmitter on one edge of the clock, typically the rising edge. The time required to transmit one bit, known as the unit interval (UI) is equal to the period of the dock. A DDR interface outputs data from the transmitter on both edges of the transmit clock (or strobe).

Conventional source synchronous memory interfaces such as, for example DDR/DDR2/DDR3 SDRAM and high speed NAND flash interface, requires a double rate (2×) clock at a physical layer to multiplex data from a memory controller single rate (1×) clock domain to DDR data, DQ, which transitions every double rate clock cycle. Additionally, a quarter cycle delay shifting of the read output data queue strobe (DOS) coming from the memory device is required to robustly sample the read output data queue (DQ) within a physical layer (PHY). Furthermore, skew must be tightly balanced across the DQ bits and between the DQS and DQ so as to maintain a good data eye at the memory interface for correct sampling the DQ by DOs within the memory device. Hence, a falling edge of a continuous dual rate (2×) clock with good duty cycle can be employed to launch the DQ bits at the same time, while the successive rising edge can launch the DQS.

The problem associated with prior art approaches is that the 2× clock toggles unnecessarily during an idle period and wastes power. Additionally, the source synchronous NAND flash (ONFI2.0) requires that the phase of the DQ relative to the DQS be switched dynamically between 90 and 180 degrees. A continuous 2× clock does not support phase switching when sampling from a continuous 1× clock. Also, it is difficult to satisfy both setup and hold requirements across process corners and OCV for high speed sampling from 1× clock to 2× clock. The setup time for the DQ path is only ¼ of the 1× period (90 degrees) and increasing the insertion delay on the 2× clock to increase setup reduces hold time on the DQS path. DQ and DQS paths require different logic to implement phase offsets from a common 2× clock. Such an approach results in a non-modular design which risks greater OCV variation due to logic and placement differences. Additionally, high speed physical layer design can suffer cross-coupling where the 2× clock can act as an aggressor against the read DQS during reads. Furthermore, read sampling of the DQ in the physical layer is highly sensitive to noise and aggressor signals, and requires a dedicated layout to avoid such noise signals.

Based on the foregoing, it is believed that a need exists for an improved system and method for interfacing a memory controller and a source synchronous memory utilizing a generic low power strobe, as described in greater detail herein.

BRIEF SUMMARY

The following summary is provided to facilitate an understanding of some of the innovative features unique to the disclosed embodiment and is not intended to be a full description. A full appreciation of the various aspects of the embodiments disclosed herein can be gained by taking the entire specification, claims, drawings, and abstract as a whole.

It is, therefore, one aspect of the disclosed embodiments to provide for an improved electronic data storage system and method.

It is another aspect of the disclosed embodiments to provide for are improved source synchronous interface.

It is a further aspect of the disclosed embodiment to provide an improved system and method for interfacing a memory controller and a source synchronous memory utilizing a generic low power strobe.

The aforementioned aspects and other objectives and advantages can now be achieved as described herein. A system and method for interfacing a memory controller and a source synchronous memory utilizing a generic low power strobe is disclosed herein. A SDR (single data rate) data from a memory controller can be converted to a source synchronous data (e.g., SDR data or DDR data) to interface with the source synchronous memory. A set of double rate (2×) strobes can be generated by gating a continuous double rate dock in order to enable the set of double rate strobes only for duration of a data transfer from controller to the memory. The data and control from the SDR continuous single rate (1×) dock domain with respect to the memory controller can be moved to the double rate clock domain (e.g., SDR data or DDR data) by sampling with the set of double rate strobes. The phase of the set of double rate strobes can be shifted in relation to the continuous single rate dock and a phase relationship of the generated synchronous signals to the memory can be dynamically switched by changing the phase of the set of double rate strobes. The set of double rate dock domain enables each bit-slice to be independently programmed to generate an output to the memory at each phase (90, 180, 270, or 360 degree phase) relative to the controller single rate clock.

The set of double rate strobes increases the setup time up to three times by shifting the phase of a set of double rate strobes relative to single rate clock. The phase can be programmed based on end-application, for example, high speed applications can increase the setup time at the expense of latency while lower speed applications can choose a minimum latency solution. A larger setup time can enable a soft RTL (Register Transfer Level) solution when the previous layer solutions are hard macro solutions. The redundant clocking in the set of double rate strobes domain can be disabled to consume low power between data transfers. The single bit-slice can be employed for all output paths to enable design, layout, and timing closure focus on the single bit-slice and replicate accordingly in order to enable a faster turn-around from design to silicon. Such modular bit-slice approach lends easy configurability and expandability. Furthermore, DQ (Data Queue) and DQS (Data Queue strobes) include identical logic paths to implement the phase offsets from the double rate clock thereby reducing the effect of OCV and skew in the design.

BRIEF DESCRIPTION OF THE DRAWINGS

The accompanying figures, in which like reference numerals refer to identical or functionally-similar elements throughout the separate views and which are incorporated in and form a part of the specification, further illustrate the present invention and, together with the detailed description of the invention, serve to explain the principles of the present invention.

DETAILED DESCRIPTION

The particular values and configurations discussed in these non-limiting examples can be varied and are cited merely to illustrate at least one embodiment and are not intended to limit the scope thereof.

The embodiments now will be described more fully hereinafter with reference to the accompanying drawings, in which illustrative embodiments of the invention are shown. The embodiments disclosed herein can be embodied in many different forms and should not be construed as limited to the embodiments set forth herein; rather, these embodiments are provided so that this disclosure will be thorough and complete and will fully convey the scope of the invention to those skilled in the art. Like numbers refer to like elements throughout. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features; integers, steps, operations, elements, and/ or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
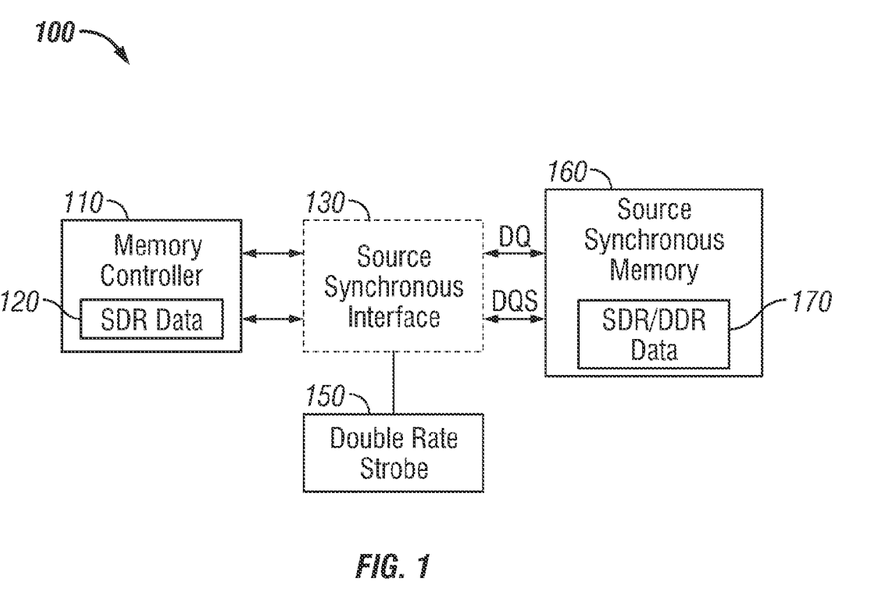
FIG. 1 illustrates a block diagram of a memory system, in accordance with the disclosed embodiments.

FIG. 1 illustrates a block diagram of a memory system 100, in accordance with the disclosed embodiments. The system 100 generally includes a memory controller 110 interfaced with a source synchronous memory 160 via a source synchronous interface 170. Note that the embodiments discussed hereinafter generally relate on an implementation of the invention in a synchronous dynamic random access (SDRAM) environment, in particular a double data rate (DDR) SDRAM memory interface between an application chip such as a memory controller and one or more DDR SDRAM memory devices. In such an environment, the data strobe signal is referred to as DQS, while the data lines are referred to as DQ. It can be appreciated, however, that such embodiments can be implemented in the context of other memory interface environments other than SDRAM environments, as well as in source synchronous communication environments other than memory interface environments.

A SDR (single data rate) data 120 from the memory controller 110 can be converted to a source synchronous data 170 to interface with the source synchronous memory 160. Note that the source synchronous data 170 can be, for example, a SDR data or DDR data, depending upon design considerations. A set of double rate (2×) strobes 150 can be generated by gating a continuous double rate clock in order to enable the set of double rate strobes only for duration of a data transfer from controller 110 to the memory 160. The memory controller 110 issues READ or WRITE commands to the source synchronous memory 160 through multiple control signals. After receiving the READ command, the source synchronous memory 160 drives multiple data DQ and data strobe DOS to memory controller 110. Memory controller 110 employs DQS to sample signal DQ to obtain read memory data.

Figure 2:
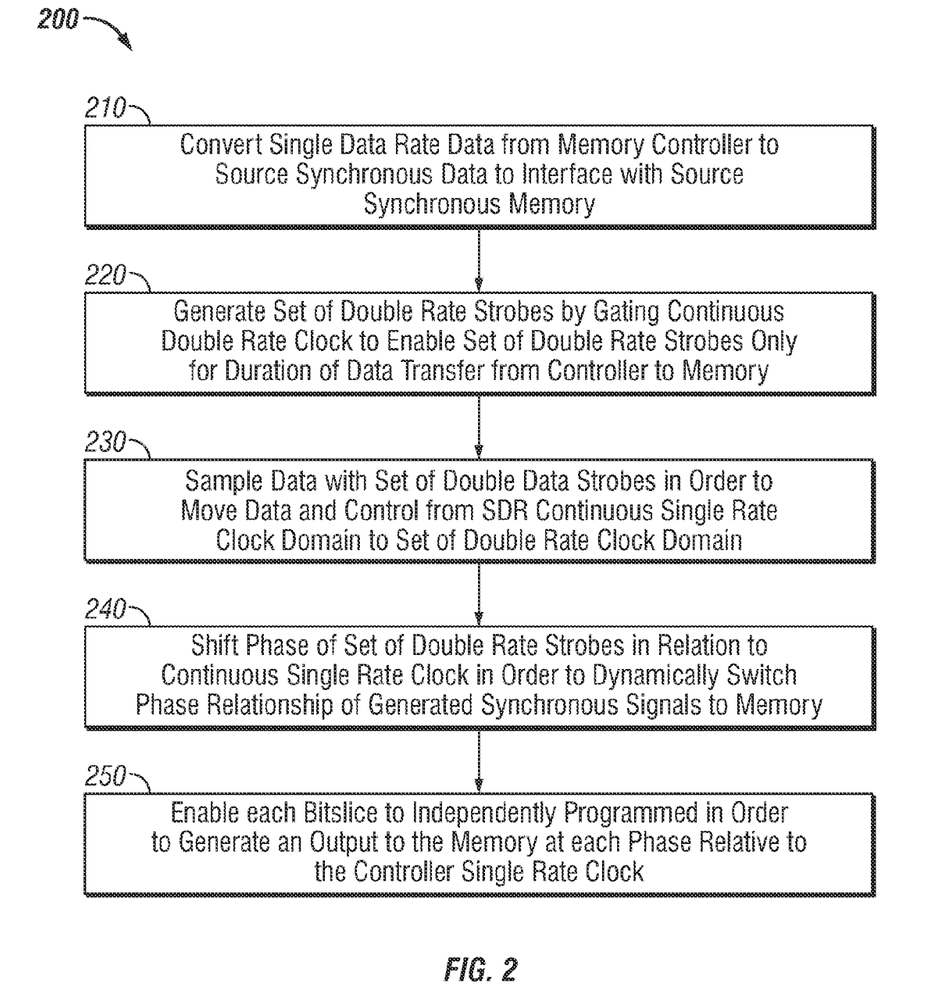
FIG. 2 illustrates a high level flow chart of operations illustrating logical operational steps of a method for interfacing the memory controller and the source synchronous memory utilizing a generic low power strobe, in accordance with the disclosed embodiments.

FIG. 2 illustrates a high level flow chart of operations illustrating logical operational steps of a method 200 for interfacing the memory controller 110 and the source synchronous memory utilizing the generic low power strobe 150, in accordance with the disclosed embodiments. Note that in FIGS. 1-9, identical parts or elements are generally indicated by identical reference numerals. The SDR data 120 from the memory controller 110 can be converted to the source synchronous data 170 (e.g., SDR data or DDR data) to interface with the source synchronous memory 160, as illustrated at block 210. A set of double rate strobes 150 can be generated by gating a continuous double rate clock in order to enable the set of double rate strobes 150, as depicted at block 220. The set of double rate strobes 150 can be enabled only for duration of a data transfer from the controller 110 to the memory 160.

The data and control from a SDR continuous single rate clock domain with respect to the memory controller 110 can be moved to a set of double rate clock domain (e.g., SDR data or DDR data) by sampling with the set of double rate strobes 150, as indicated at block 230. The phase of the set of double rate strobes 150 can be shifted in relation to the continuous single rate clock and a phase relationship of the generated synchronous signals to the memory 160 can be dynamically switched by changing the phase of the set of double rate strobes 150, as depicted at block 240. The set of double rate clock domain enables each bit-slice to be independently programmed to generate an output to the memory at each phase (90, 180, 270, or 360 degree phase) relative to the controller single rate clock, as illustrated at block 250.

Figure 3:
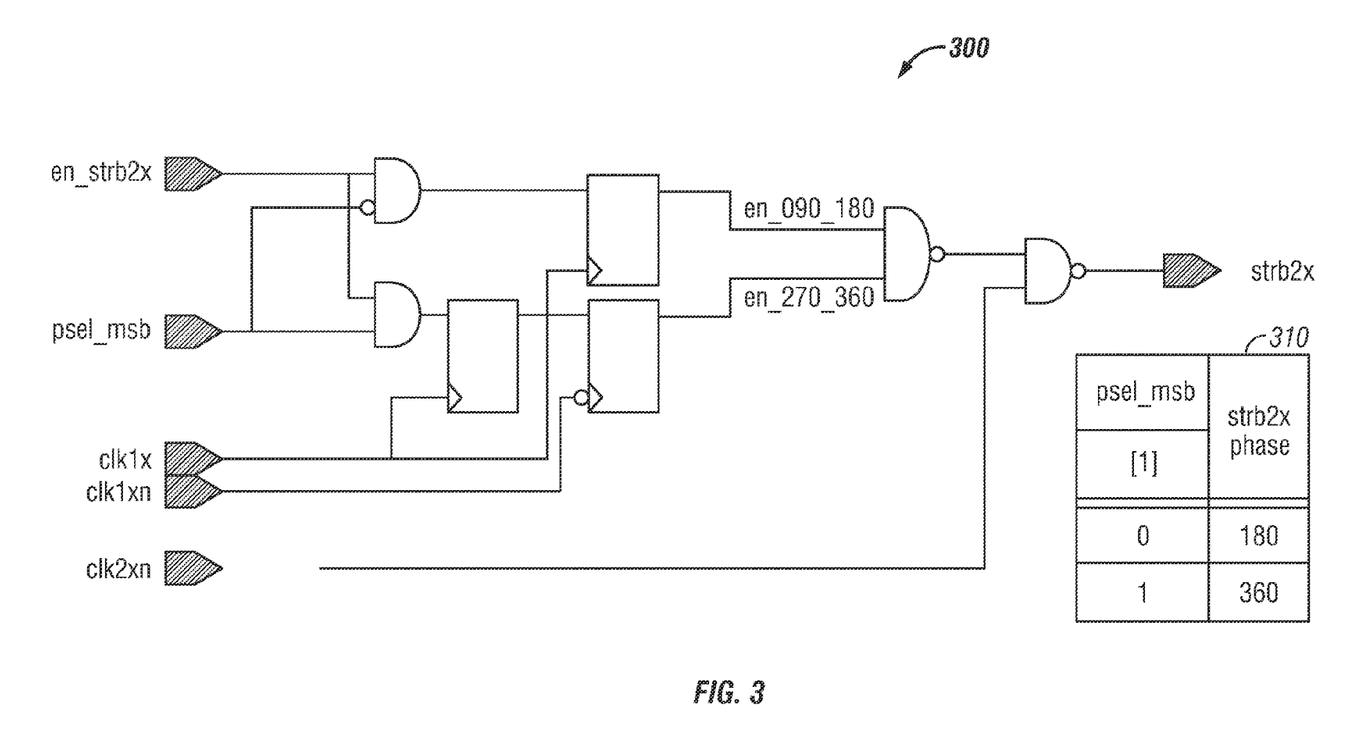
FIG. 3 illustrates a dock generator logic circuit diagram for generating a set of double rate (2×) strobes by gating a continuous double rate, in accordance with the disclosed embodiments.

FIG. 3 illustrates a clock generator logic circuit diagram 300 for generating the set of double rate (2×) strobes by gating a continuous double rate, in accordance with the disclosed embodiments. The clock generator circuit 300 can be employed for generating the 2× strobe strb2× from the running 2× clock (clk2×). The clock generator is a circuit that produces a timing signal as a clock signal and behaves as such for use in synchronizing a circuit's operation. The logic inputs for generating a 2× strobe can be clk2×, clk1×, clk1×n, en_strb2×, and psel_msb. A clk2× can be a free running 2× clock and clk1× represents a 1× clock that can be derived from the 2× clock going to the clock generator (clkgen) and is phase aligned with the 2× clock, A clk1×n can be an inverted version of clk1×. An en_strb2× represents a signal from 1× clock domain that can be asserted for the duration of data coming from the controller and disable with respect to the duration of data. A psel_msb represents a most significant bit of a 2 bit control input from the 1× clock domain. The most significant bit (msb), also called the high-order bit, is the bit position in a binary number having the greatest value. The psel_msb determines the phase of the strb2× relative to the clk1× and it controls the relative phase to be 180 when '0' or 360 degrees when '1' with respect to the truth table 310. The output of the clock generator can be strb2× that is fed to the write bit-slices.

Figure 4:
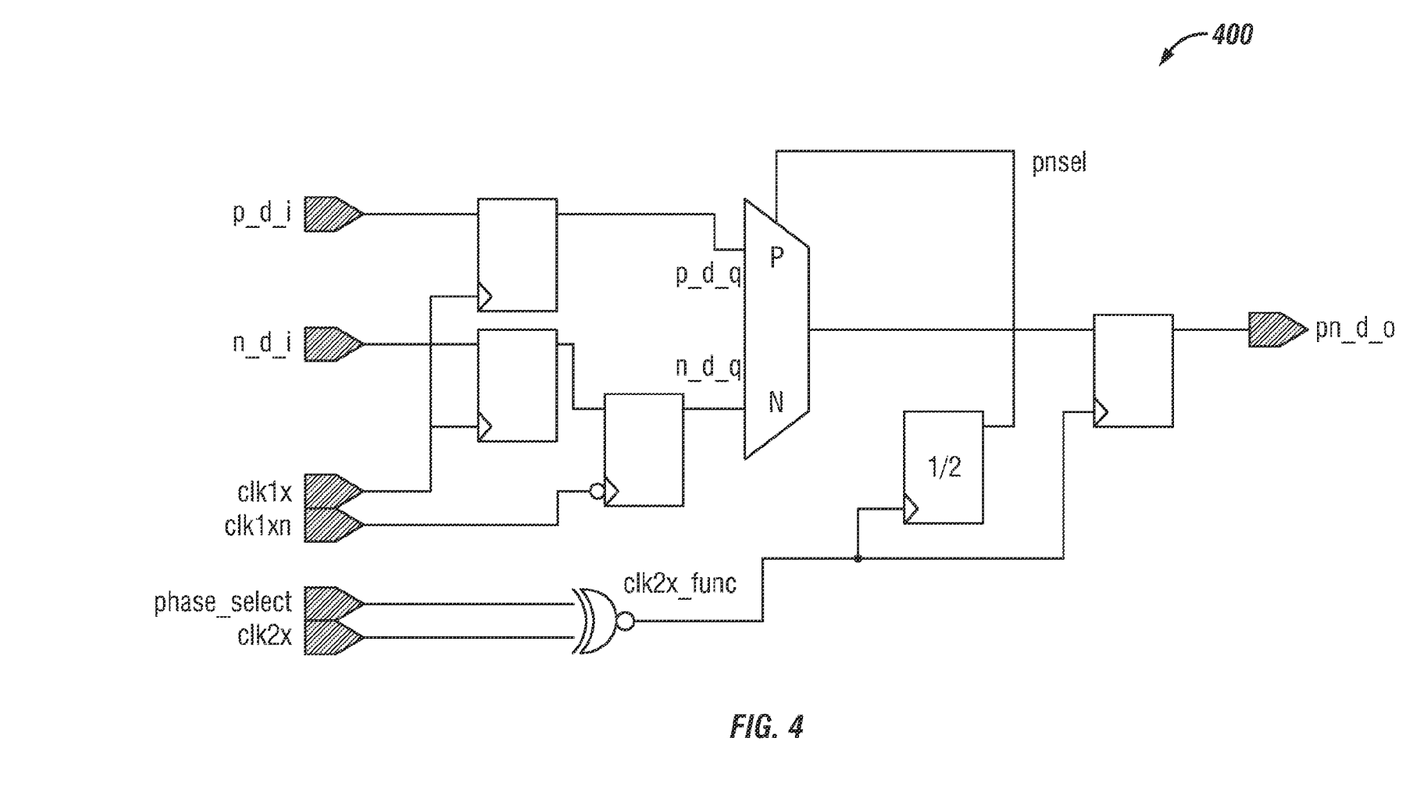
FIG. 4 illustrates a dock generator circuit diagram for generating a single bit stream of DOR data, in accordance with the disclosed embodiments.

FIG. 4 illustrates a clock generator circuit diagram 400 for generating a single bit stream of DDR data, in accordance with the disclosed embodiments. The write bit-slice is indicated in FIG. 4 and the logic function takes 2 bits (positive and negative) of data from the 1× clock domain controller and multiplex to a single bit stream of DDR data. The logic function can be employed to determine the positive and negative of data with respect to the 2 bit from the 1× clock domain controller and multiplex to a single bit stream of DDR data. The inputs to the logic can be clk2×, clk1×, clk1×n, phase_select, p_d_i, n_d_i, and the outputs can be pn_d_o. The clk2× can be connected to a strobe from the clock generator (clkgen) logic. The clk1× represents 1× clock that can be derived from the 2× clock going to the clkgen and is phase aligned with the 2× clock. The clk1×n represents an inverted version of clk1×. A phase_select determines the phase of the clk2×_func relative to the clk1×.

The clk2×_func can be the inverse of clk2× and shifts the phase of clk2× by 90 degrees when '0' and the clk2× funs can be the same as clk2× when '1'. A p_d_i represents 1× data from the controller that can be multiplexed to each positive bit of the DDR output bit stream and n_d_i can be 1× data from the controller that can be multiplexed to each negative bit of the DDR output bit stream. The output of the pn_d_o can be DDR bit-slice to be sent to the source synchronous interface. Bit-slicing is a technique for constructing a processor from modules of smaller bit width. Each of these components processes one bit field or "slice" of an operand. The grouped processing components would then have the capability to process the chosen full word-length of a particular software design.

Figure 5:
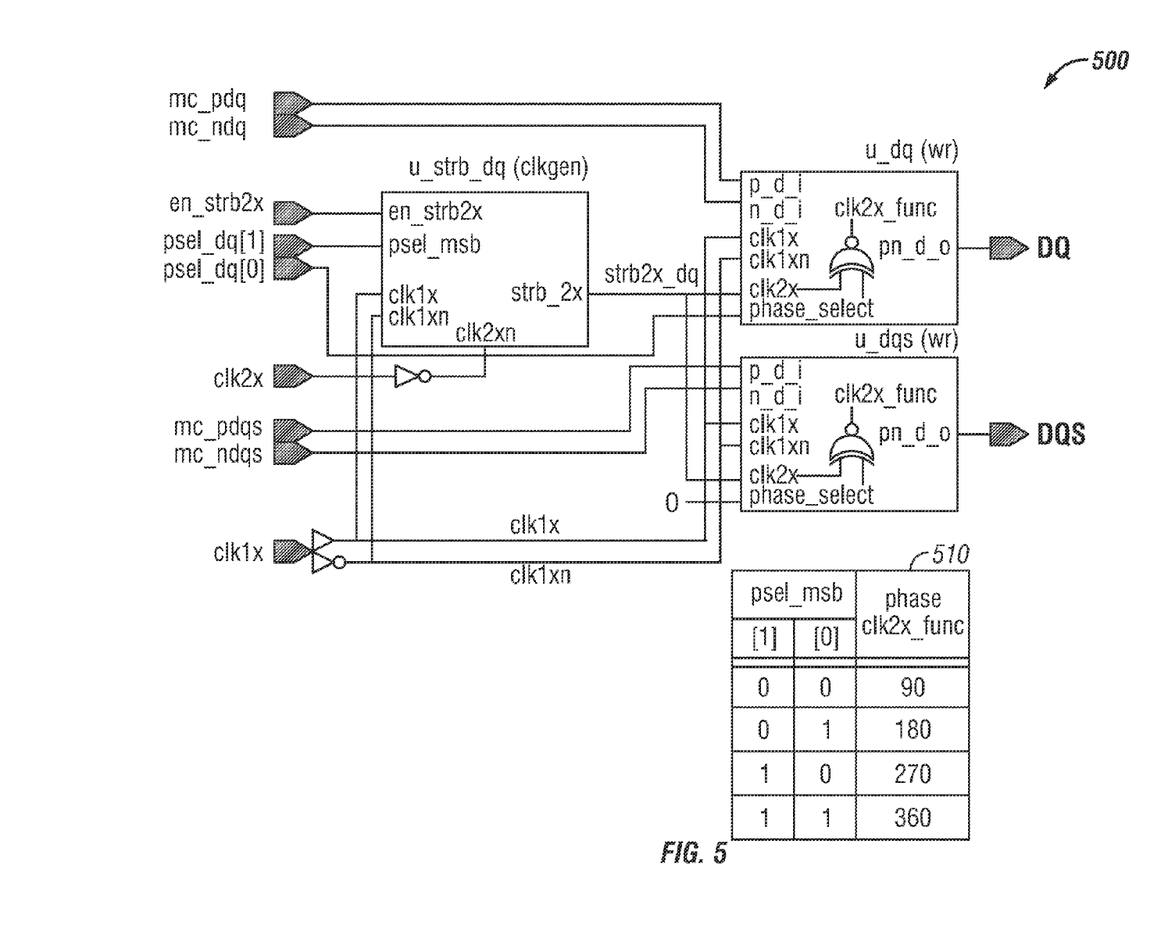
FIG. 5 illustrates a clock generator circuit diagram for generating DQ and DQS output signals, in accordance with the disclosed embodiments.

FIG. 5 illustrates a clock generator circuit 500 for generating DQ and DQS output signals, in accordance with the disclosed embodiments. The clock generator circuit 500 connects two write bit-slices to create the DQ and DQS output signals. The input signals for creating the DQ and DQS output signals can be clk2×, clk1×, en_strb2×, psel_dq [1:0], mc_pdq, mc_ndq, mc_pdqs, and mc_ndqs. The clk2× represents the 2× clock and clk1× represents a 1× clock derived from the 2× clock and it is phase aligned with the 2× clock. An en_strb2× represents a 1× signal, when high the en_strb2× can cause the clkgen to output a 2× strobe from its strb_2× port.

A psel_dq [1:0] represents a 1× bus utilized to control phase of clk2×_func within the DQ write bit-slice. A mc_pdq represents the 1× data from the controller that can be multiplexed to each positive bit of DQ, mc_ndq is the 1× data from the controller that can be multiplexed to each negative bit of DQ. A mc_pdqs is the 1× data from the controller that can be multiplexed to each positive bit of DQS, and a mc_ndqs represents the 1× data from the controller that can be multiplexed to each negative bit of DQS. The outputs of the logic circuit 500 are DQ, which represents a DDR signal to be used in a source synchronous interface, and DQS represents a DDR signal to be used in a source synchronous interface. The clock generator circuit 500 creates DQ and DQS that can be offset 0, 90, 180, or 270 degrees to each other depending on the value of psel_dq[1:0] and the controller data at mc_pdq and mc_ndq. DQ and DQS are synchronous with each other because of the common source strobe strb2×_dq.

Figure 6:
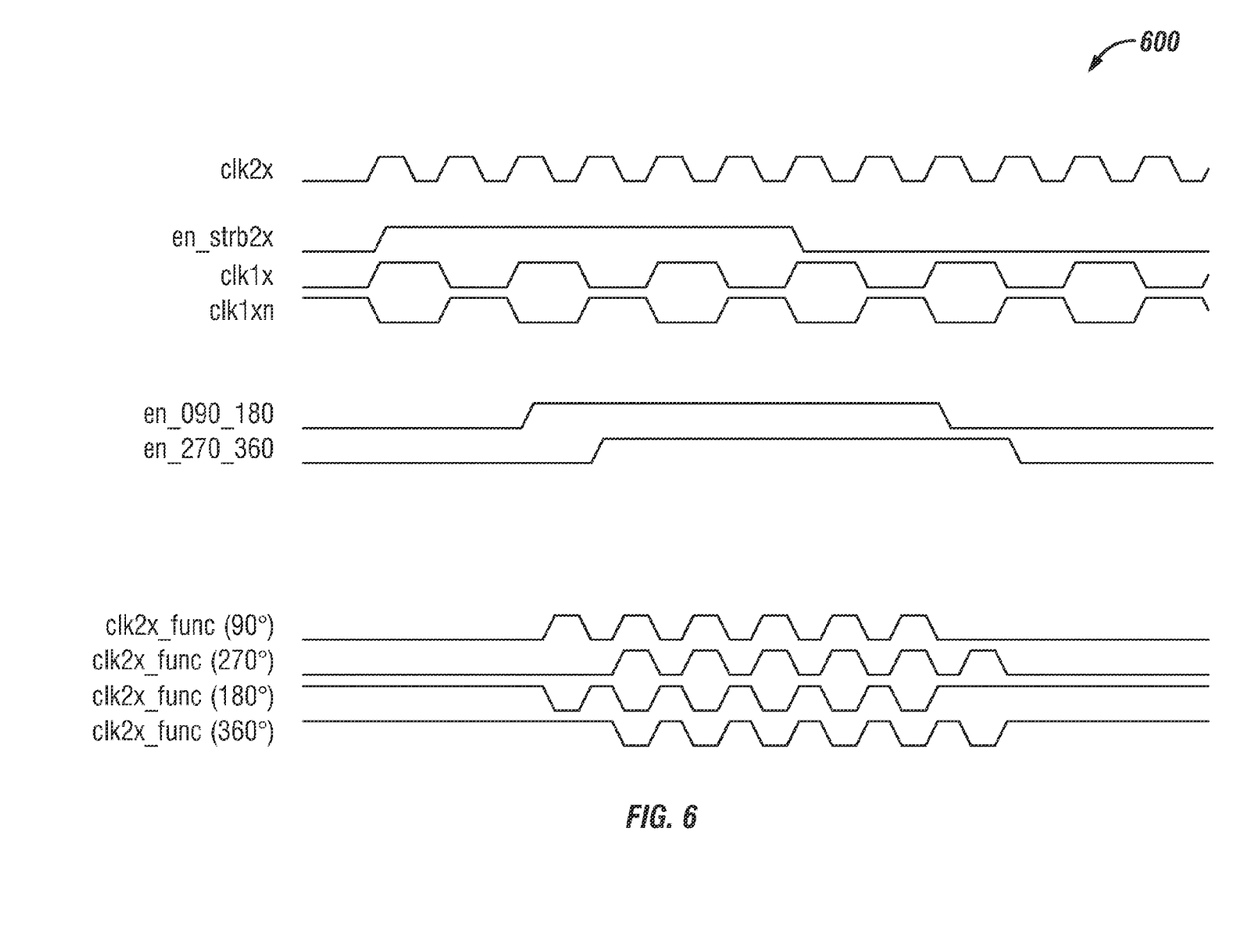
FIG. 6 illustrates a timing diagram illustrating possible phases of clock signals in FIGS. 3-4, in accordance with the disclosed embodiments.
Figure 7:
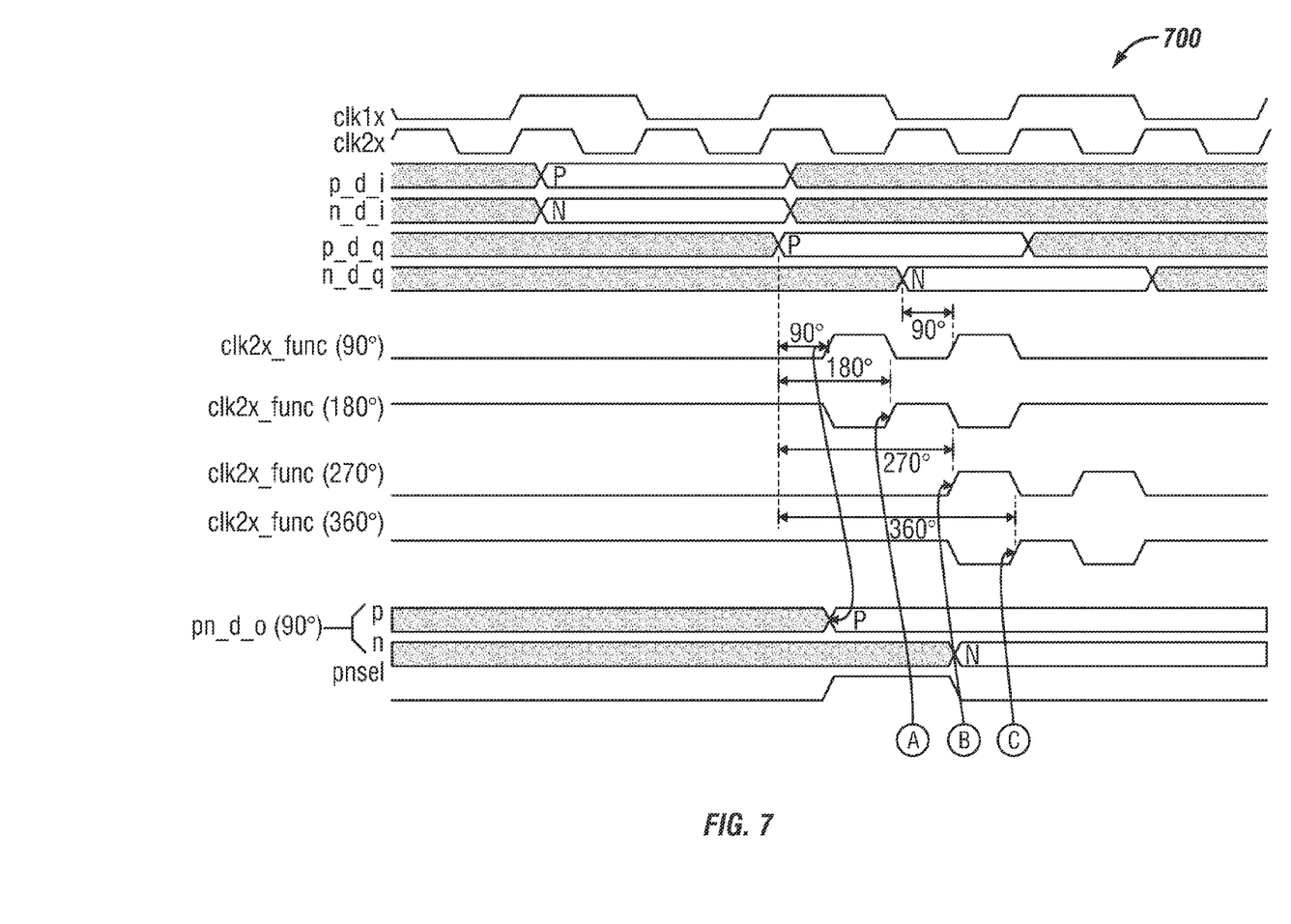
FIG. 7 illustrates a timing diagram ustrating possible phases of output signal with respect to FIG. 4, in accordance with the disclosed embodiments.

FIG. 6 illustrates a timing diagram 600 illustrating possible phases of clock signals in FIGS. 3-4, in accordance with the disclosed embodiments. The timing diagram 600 represents all possible phases of the clk2×_func in a write bit-slice. The upper signals represents FIG. 3 and the lower signals represents clk2×_func in FIG. 4. FIG. 7 illustrates a timing diagram 700 illustrating possible phases of output signal with respect to FIG. 4, in accordance with the disclosed embodiments. The timing diagram 700 represents all possible phases of the pn_d_o of the write bit-slice of FIG. 4. Each p, n pair represents the positive and negative bit of the pn_d_o. A pn_d_o can be a multiplexed version of each p, n pair. Note that as the phase of clk2×_func increases from 90 degree relative to clk1× to 360 degree, the available setup time from clk1× to clk2×_func increases. For DDR applications with respect to DQ and DQS shifted by 90 degrees, the disclosed embodiments will support 2× clock frequencies 3 times greater than existing solutions with a continuous clk2×_func.

Figure 8:
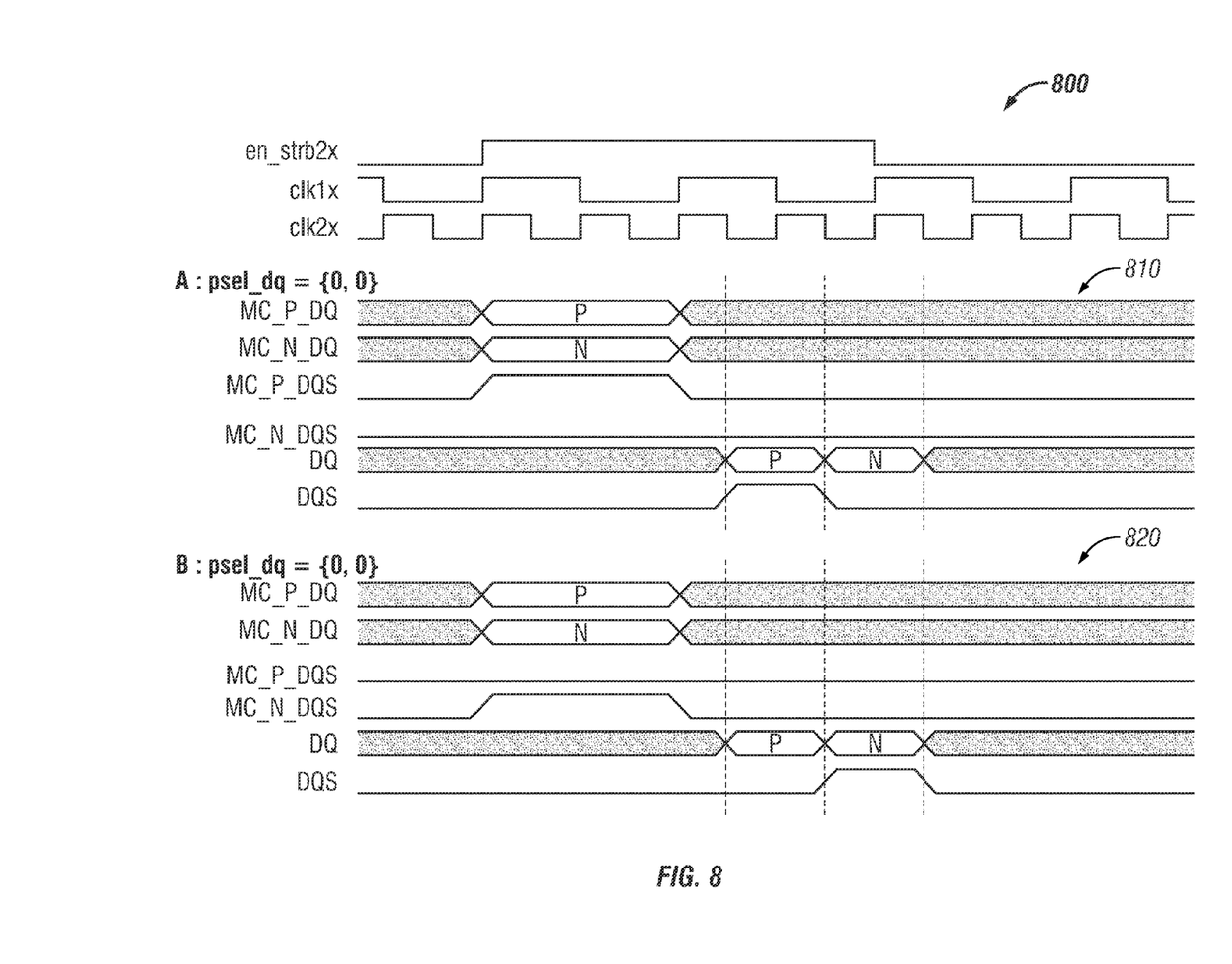
FIGS. 8-9 illustrate a timing diagram with respect to DQ and DQS output signals, in accordance with the disclosed embodiments.
Figure 9:
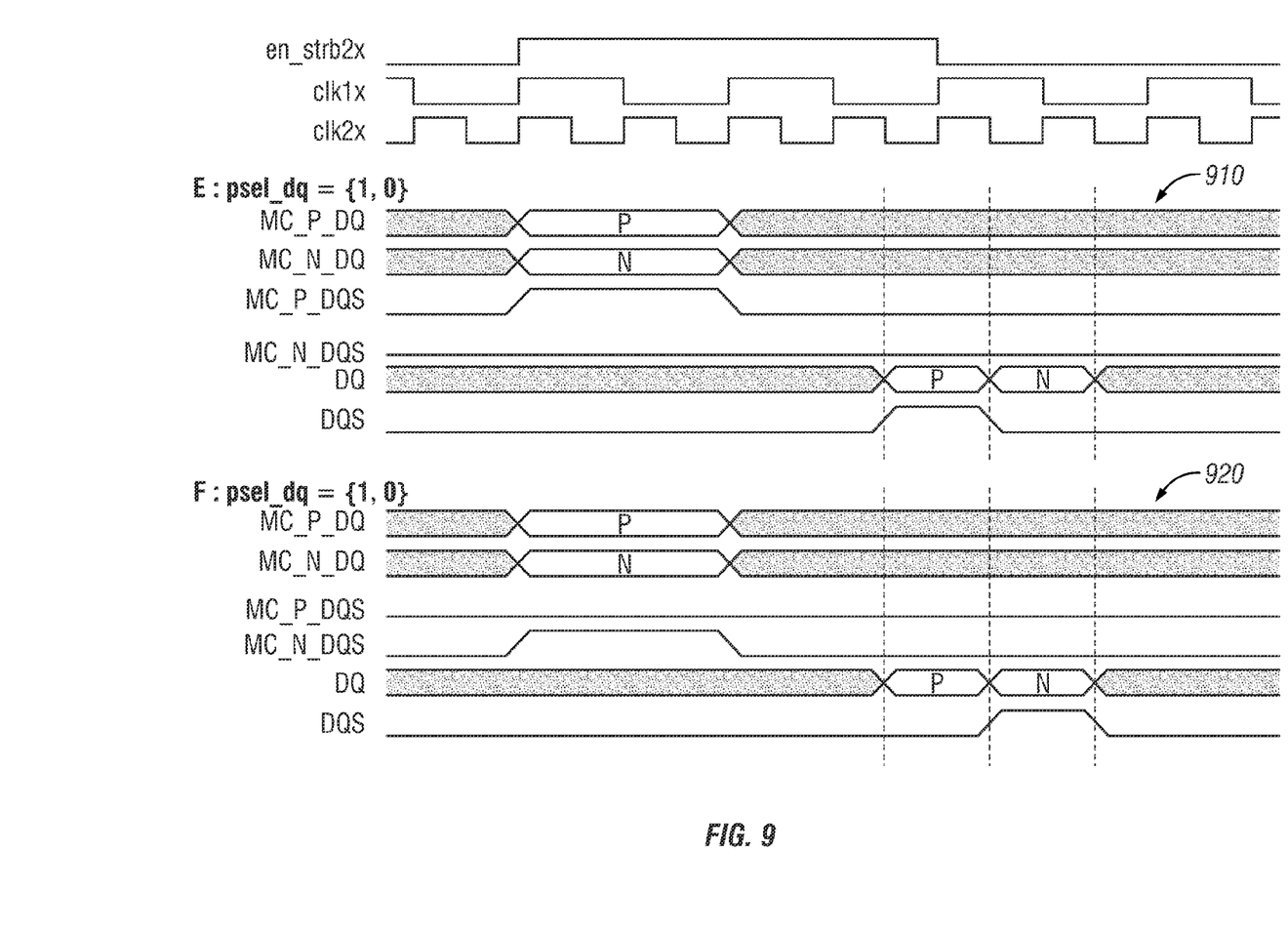

FIGS. 8-9 illustrate a timing diagram 800 and 900 with respect to DQ and DQS output signals, in accordance with the disclosed embodiments. The timing relationships of the DQ and DQS output signals based on the settings of psel_dq [0:0] along with the placements of a high cycle on either MC_P_DQS or MC_N_DQS. The combination of both permits a 0, 90, 270, or 360 degree relative phase relationship between DQ and DQS. The timing diagram 810 represents DDR and DQS aligned and timing diagram 820 represents DQS switching 180 degrees after DQ by swapping the values on MC_P_DQS or MC_N_DQS.

The timing diagram 830 is similar, but MC_P_DQS or MC_N_DQS hold the same "ADR" value. This results in DQ being SDR and DQS being centered within DQ. This relationship can be employed for DDR address and command interface, source synchronous NAND flash address and command transfers on DQ, and flash control transfers. The timing diagram 840 represents DQS switching 90 degrees after DQ and can be centered within each DDR DQ eye. This relationship can be employed for DDR data interfaces and source synchronous NAND flash program writes. The timing relationship 910, 920, 930 and 940 are similar to 810-840 respectively, but with DQ and DQS shifted out by 180 degrees. Such a scenario can be employed when set up time from clk1× to clk2×_func in the wr bit-slice need to be increased to achieve a higher data frequency.

The phase can be programmed based on end-application, for example, high speed applications can increase the setup time at the expense of latency while lower speed application can choose a minimum latency solution. A larger setup time can enable a soft RTL (Register Transfer Level) solution when the previous layer solutions are hard macro solutions. The redundant clocking in the set of double rate strobes domain can be disabled to consume low power between data transfers. The single bit-slice can be employed for all output paths to enable design, layout, and timing closure focus on the single bit-slice and replicate accordingly in order to enable a faster turn-around from design to silicon. Such modular bit-slice approach lends easy configurability and expandability. Furthermore, DQ and DQS includes identical logic paths to implement the phase offsets from a double rate clock thereby reducing the effect of OCV and skew in the design.

It will be appreciated that variations of the above-disclosed and other features and functions, or alternatives thereof, may be desirably combined into many other different systems or applications. Also, that various presently unforeseen or unanticipated alternatives, modifications, variations or improvements therein may be subsequently made by those skilled in the art which are also intended to be encompassed by the following claims.

What is claimed is:

1. A method for interfacing a memory controller and a source synchronous memory, comprising:
   generating a set of double rate strobes by gating a continuous double rate dock in order to enable said set of double rate strobes only for duration of a data transfer from a memory controller to a source synchronous memory in order to reduce power;
   moving data and control from a single data rate continuous clock domain to a source synchronous data rate with respect to said source synchronous memory by sampling with said set of double rate strobes;
   shifting a phase of said set of double rate strobes in relation to said continuous single rate clock and changing said phase of said set of double rate strobes in order to dynamically switch a phase relationship of said source synchronous data signal to said memory; and
   independently programming each bit-slice to generate an output to said memory at each phase relative to said controller single rate clock by said set of double rate strobes.

2. The method of claim 1 further comprising converting said single data rate data from said memory controller to said source synchronous data to interface with said source synchronous memory.

3. The method of claim 1 wherein said source synchronous data comprises a single data rate data.

4. The method of claim wherein said source synchronous data comprises a double data rate data.

5. The method of claim 1 further comprising increasing a setup time up to three times by shifting said phase of said set of double rate strobes relative to said single rate clock by said set of double rate strobes.

6. The method of claim 1 further comprising programming said phase of said set of double rate strobes based on an end-application.

7. The method of claim 1 further comprising disabling a redundant clocking in said set of double rate strobes to consume low power between said data transfer.

8. The method of claim 1 further comprising configuring said single bit-slice for an output path to enable a design and a timing closure focus on said single bit-slice and replicate accordingly in order to enable a faster turn-around.

9. The method of claim 1 further comprising configuring an identical logic path to implement said phase offset from said double rate dock with respect to a data queue and a data queue strobe thereby reducing an effect of on-chip variation and skew.

10. A system for interfacing a memory controller and a source synchronous memory, said system comprising:
    means for generating a set of double rate strobes by gating a continuous double rate clock in order to enable said set of double rate strobes only for duration of a data transfer from a memory controller to a source synchronous memory in order to reduce power;
    means for moving data and control from a single data rate continuous clock domain to a source synchronous data rate with respect to said source synchronous memory by sampling with said set of double rate strobes;
    means for shifting a phase of said set of double rate strobes in relation to said continuous single rate dock and changing said phase of said set of double rate strobes in order to dynamically switch a phase relationship of said source synchronous data signal to said memory; and
    means for independently programming each bit-slice to generate an output to said memory at each phase relative to said controller single rate clock by said set of double rate strobes.

11. The system of claim 10 further comprising means for converting said single data rate data from said memory controller to said source synchronous data to interface with said source synchronous memory.

* * * * *